(12) United States Patent
Ukigaya

(10) Patent No.: US 10,424,757 B2
(45) Date of Patent: Sep. 24, 2019

(54) ORGANIC LIGHT EMITTING APPARATUS, METHOD FOR MANUFACTURING ORGANIC LIGHT EMITTING APPARATUS, AND IMAGING APPARATUS

(71) Applicant: CANON KABUSHIKI KAISHA, Tokyo (JP)

(72) Inventor: Nobutaka Ukigaya, Oita (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/950,985

(22) Filed: Apr. 11, 2018

(65) Prior Publication Data

US 2018/0301655 A1   Oct. 18, 2018

(30) Foreign Application Priority Data

Apr. 17, 2017   (JP) ................. 2017-081521

(51) Int. Cl.

| H01L 51/52 | (2006.01) |
| H01L 51/50 | (2006.01) |
| H01L 27/32 | (2006.01) |
| H01L 51/56 | (2006.01) |
| H01L 27/30 | (2006.01) |

(52) U.S. Cl.
CPC ........ *H01L 51/5203* (2013.01); *H01L 27/322* (2013.01); *H01L 27/3276* (2013.01); *H01L 51/5012* (2013.01); *H01L 51/5056* (2013.01); *H01L 51/5072* (2013.01); *H01L 51/5092* (2013.01); *H01L 51/5206* (2013.01); *G09G 2310/0264* (2013.01); *H01L 27/307* (2013.01); *H01L 51/56* (2013.01)

(58) Field of Classification Search
CPC ............. H01L 51/5203; H01L 51/5206; H01L 27/322; H01L 27/3276; H01L 51/5056; H01L 51/5012; H01L 51/5072; H01L 51/5092; H01L 27/307; H01L 51/56; G09G 2310/0264

See application file for complete search history.

(56) References Cited

U.S. PATENT DOCUMENTS

2001/0026125 A1* 10/2001 Yamazaki ........... H01L 27/3246
                                                     313/505
2005/0142379 A1*  6/2005 Juni .................... G02B 5/0242
                                                     428/690

FOREIGN PATENT DOCUMENTS

JP    2006-303463      *  3/2006
JP    2006-303463  A    11/2006

* cited by examiner

*Primary Examiner* — Karen Kusumakar
(74) *Attorney, Agent, or Firm* — Canon U.S.A. Inc., IP Division

(57) ABSTRACT

An organic light emitting apparatus including a first electrode, a second electrode, and an organic layer disposed between the first electrode and the second electrode and including a light emitting layer. The first electrode includes a metallic layer containing a first metal and a mixture layer disposed between the metallic layer and the organic layer. The mixture layer contains the first metal and a second metal having lower reflectance than the first metal.

25 Claims, 9 Drawing Sheets

ORGANIC LIGHT EMITTING APPARATUS, METHOD FOR MANUFACTURING ORGANIC LIGHT EMITTING APPARATUS, AND IMAGING APPARATUS

BACKGROUND OF THE INVENTION

Field of the Invention

The present disclosure relates to an organic light emitting apparatus, a method for manufacturing an organic light emitting apparatus, and an imaging apparatus.

Description of the Related Art

An organic light emitting element (an organic electroluminescence element: an organic EL element) generates light by recombining an electron injected from a cathode and a hole injected from an anode in an organic light emitting layer. The generated light is emitted from a cathode side, an anode side, or both of them.

For example, an active matrix organic EL display apparatus using the organic light emitting element includes a pixel driving circuit disposed on a substrate and including a driving transistor and a multilayered wiring structure, and the organic light emitting element disposed on the pixel driving circuit. As such an organic light emitting display apparatus, there is known a reflective organic EL display apparatus that uses a light-transmissive electrically conductive material for one of electrodes, and causes the light generated in the organic light emitting layer to be reflected by the other of the electrodes to extract the light from the one of the electrodes.

Generally, such a reflective organic EL display apparatus uses an electrically conductive layer having high reflectance as the one of the electrodes, and forms a cavity structure by an organic layer including a light emitting layer and both the electrodes. In the cavity structure, a film thickness of the organic layer is set so as to satisfy a multiple interference condition based on an emission wavelength. This setting improves efficiency of extracting the light outward, and, further, allows an emission spectrum to be controlled.

The reflective organic light emitting apparatus may be provided with another electrically conductive layer disposed between the reflective electrode and the organic layer to improve the performance. Japanese Patent Application Laid-Open No. 2006-303463 discusses a method that forms an electrically conductive film made from a high melting point metal material on a reflective metallic layer such as aluminum that is the reflective electrode. Aluminum, if being oxidized, acquires a property closer to an insulating characteristic after the oxidation, and therefore undesirably exhibits high contact resistance. This results in a failure to sufficiently supply a current and an increase in a driving voltage, thereby making it difficult to use aluminum as the electrode. Then, the oxidation of the surface of the reflective metallic layer can be prevented or reduced by forming the electrically conductive film made from the high melting point metal material on the reflective electrode.

SUMMARY OF THE INVENTION

According to an aspect of the present disclosure, an organic light emitting apparatus includes a first electrode, a second electrode, and an organic layer disposed between the first electrode and the second electrode and including a light emitting layer. The first electrode includes a metallic layer containing a first metal and a mixture layer disposed between the metallic layer and the organic layer. The mixture layer contains the first metal and a second metal having lower reflectance than the first metal.

According to another aspect of the present disclosure, an organic light emitting apparatus includes a first electrode, a second electrode, and an organic layer disposed between the first electrode and the second electrode and including a light emitting layer. The first electrode includes a metallic layer containing aluminum or silver, and a mixture layer disposed between the metallic layer and the organic layer and containing at least one of titanium, molybdenum, and tungsten, and the metal contained in the metallic layer.

According to yet another aspect of the present disclosure, a method for manufacturing an organic light emitting apparatus includes forming a metallic film containing a first metal, forming a mixture layer containing the first metal and a second metal having lower reflectance than the first metal on the metallic film, forming an organic layer after forming the mixture layer, and forming a second electrode on the organic layer.

Further features of the present disclosure will become apparent from the following description of exemplary embodiments with reference to the attached drawings.

DESCRIPTION OF THE EMBODIMENTS

A film thickness of the electrically conductive film made from the high melting point metal material should be sufficiently thick to prevent the oxidation of the reflective electrode, as discussed in Japanese Patent Application Laid-Open No. 2006-303463. As a result, an amount of the light emitted after being reflected by the reflective electrode undesirably reduces because, as the film thickness of the electrically conductive film made from the high melting point metal increases, light transmittance of this electrically conductive film unintentionally reduces.

According to several exemplary embodiments, it is possible to provide an organic light emitting apparatus that prevents or cuts down the reduction in the light emission amount while preventing or cutting down the increase the driving voltage of the organic light emitting apparatus.

In the following description, organic light emitting apparatuses according to the present exemplary embodiments will be described in detail with reference to the drawings. Any of the exemplary embodiments that will be described below indicates merely one example, and is not intended to limit the present invention regarding numerical values, shapes, materials, components, a layout and a connection state of the components, and the like.

A First Exemplary Embodiment

Figure 1:
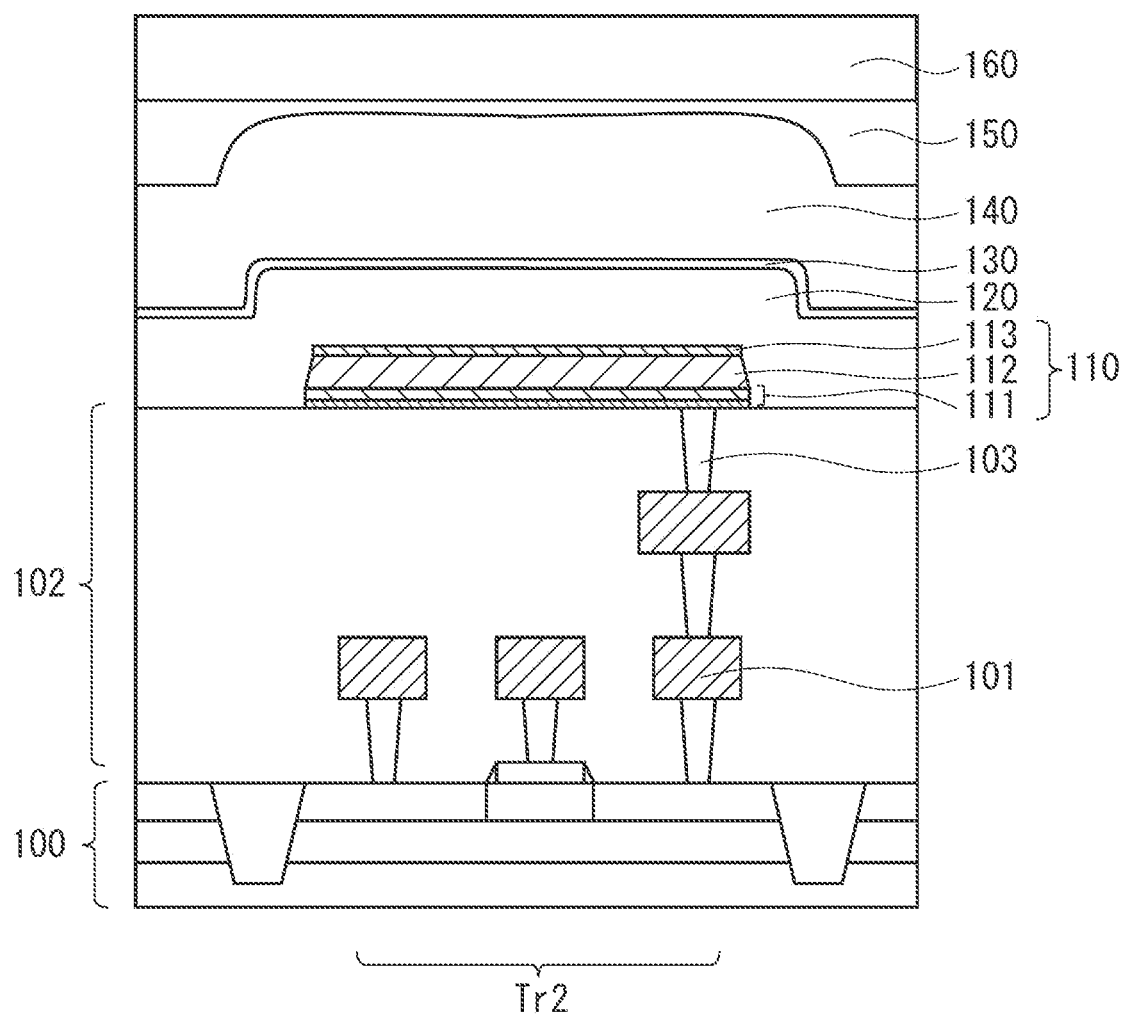
FIG. 1 is a cross-sectional view of one example of a pixel in an organic light emitting apparatus according to a first exemplary embodiment.

FIG. 1 is a cross-sectional view illustrating one example of a pixel forming an organic light emitting apparatus according to a first exemplary embodiment. The pixel illustrated in FIG. 1 includes a substrate 100, a transistor Tr2, a multilayered wiring structure 102, plugs 103, a first electrode 110, an organic layer 120, a second electrode 130, a moisture exclusion layer 140, a planarization layer 150, and a color filter 160. For example, a silicon substrate can be used as the substrate 100. In FIG. 1, an organic light emitting element EL includes the first electrode 110, the organic layer 120, and the second electrode 130.

Figure 2:
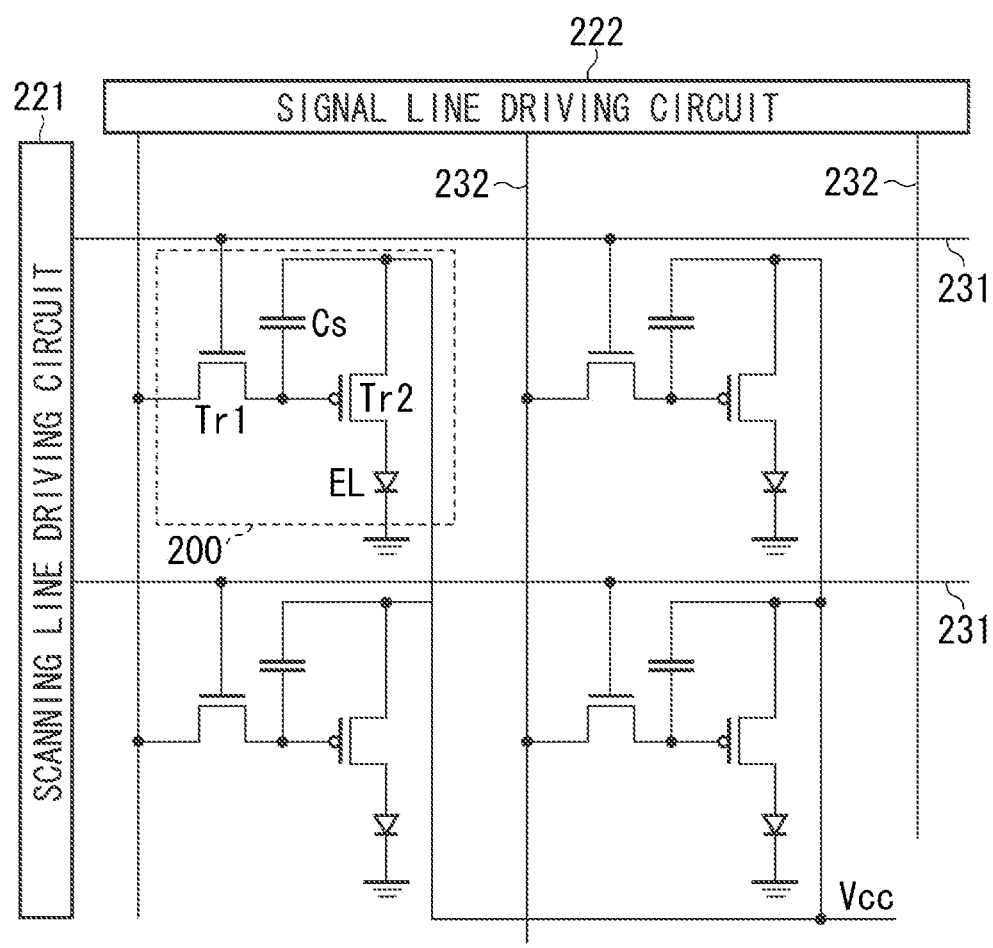
FIG. 2 is an equivalent circuit diagram of one example of the organic light emitting apparatus according to the first exemplary embodiment.

FIG. 2 is an equivalent circuit diagram of one example of a pixel 200. The organic light emitting apparatus according to the present exemplary embodiment includes a display region including a plurality of pixels 200 arrayed in a matrix form, and a peripheral region arranged around the display region scanning line driving circuit 221, which outputs a scanning signal to a plurality of scanning lines 231, and a signal line driving circuit 222, which outputs a video signal to a plurality of signal lines 232, are provided in the peripheral region.

Each of the pixels 200 is connected to the scanning line 231 and the signal line 232 corresponding to each of them, and includes a switching transistor Tr1, the driving transistor Tr2, a holding capacitor Cs, and the organic light emitting element EL. In the present example, the pixel 200 will be described based on an example in which a negative (N)-type metal oxide semiconductor (MOS) transistor and a positive (P)-type MOS transistor are used as the switching transistor Tr1 and the driving transistor Tr2, respectively, but the transistors Tr1 and Tr2 are not limited thereto.

A gate of the switching transistor Tr1 is connected to the scanning line 231, and one of a source and a drain thereof is connected to the signal line 232. Further, the other of the source and the drain of the switching transistor Tr1 is connected to a gate of the driving transistor Tr2 and one of electrodes of the holding capacitor Cs. The other of the electrodes of the holding capacitor Cs and one of a source and a drain of the driving transistor Tr2 are connected to a power source line Vcc. The other of the source and the drain of the driving transistor Tr2 is connected to the organic light emitting element EL.

In the organic light emitting apparatus illustrated in FIG. 2, the switching transistor Tr1 is set to an ON state by the scanning line driving circuit 221, so that the video signal is written from the signal line 232 into the pixel 200, and the written video signal is held in the holding capacitor Cs. A current according to the held video signal is supplied from the driving transistor Tr2 to the organic light emitting element EL, and the organic light emitting element EL emits light at a luminance according to the current. In the present example, the organic light emitting apparatus will be described based on an example in which the driving transistors Tr2 and the holding capacitors Cs of the plurality of pixels 200 are connected to the common power source line Vcc.

The above-described configuration of the pixel circuit is one example, and the pixel 200 may include an additional capacitor element and transistor as necessary. Further, the peripheral circuit can also include a driving circuit necessitated according to the configuration of the pixel 200 as appropriate.

In FIG. 1, the multilayered wiring structure 102 including a plurality of wirings and a plurality of interlayer insulating layers is formed on the transistor Tr2. The first electrode 110 of the organic light emitting element EL is disposed on the multilayered wiring structure 102. The first electrode 110 is connected to the driving transistor Tr2 via the wirings 102 and the plugs 103 in the multilayered wiring structure 102. Further, a metal-insulator-metal (MIM) capacitor disposed in the multilayered wiring structure 102 as a capacitor element Ca.

The multilayered wiring structure 102 may include a light shielding layer (not illustrated) to prevent the light from the organic light emitting element EL or the like from affecting a transistor characteristic. For example, an aluminum alloy can be used as a material of wiring layers 101, and, for example, tungsten can be used as a material of the plugs 103 connecting the wiring layers 101. Further, films made from, for example, silicon oxide can be used for the interlayer insulating films. For example, titanium (Ti) or titanium nitride (TiN) can be used as a material of the light shielding layer. In the multilayered wiring structure 102, it is desirable to use an inorganic insulating film having a planarized surface as an insulating layer serving as a foundation of the first electrode 110 to reduce unevenness of a film thickness of the first electrode 110.

The substrate 100, the transistor Tr2, and the multilayered wiring structure 102 will be referred to as a circuit substrate. The organic light emitting element EL is disposed on the circuit substrate. An organic light emitting element EL of a reflective organic light emitting apparatus is configured in such a manner that one and the other of electrodes disposed on both sides of an organic layer are a reflective electrode and a light-transmissive electrode, respectively, and light generated in the organic layer is reflected by the one of the electrodes and emitted from the other of the electrodes. In the present example, the organic light emitting apparatus will be described based on an example in which the first electrode 110 is the reflective electrode, and the second electrode 130 is the light-transmissive electrode.

Now, the reflective electrode is defined to be an electrode having reflectance exceeding 50% with respect to the light generated in the organic light emitting layer. In a case where the electrode has a configuration in which a plurality of films is stacked, the reflective electrode is defined to be an electrode having reflectance exceeding 50% when the plurality of films is regarded as one electrode. Further, the light-transmissive electrode is defined to be an electrode having light transmittance exceeding 50% with respect to the light generated in the organic light emitting layer. In a case where the electrode has a configuration in which a plurality of films is stacked, the light-transmissive electrode is defined to be an electrode having light transmittance exceeding 50% when the plurality of films is regarded as one electrode.

The organic layer 120 includes a light emitting layer, and has a structure formed by stacking, for example, a hole injection layer, a hole transport layer, the light emitting layer, an electron transport layer, and an electron injection layer. The organic layer 120 is not limited to this structure, and the hole injection layer, the hole transport layer, the electron transport layer, and the electron injection layer may be provided in a different manner as long as they are provided as appropriate according to a design of the element. Each of the layers of the organic layer 120 can be formed with use of a known organic material as appropriate.

The second electrode 130 is the light-transmissive electrode, and can be prepared by forming and patterning an electrically conductive film. The electrically conductive film can be formed with use of a transparent electrode material, such as indium tin oxide (ITO) and indium zinc oxide (IZO). Further, especially in a case where the organic light emitting element EL is constructed as a cavity structure, the second electrode 130 should be not only light-transmissive but also reflective with respect to the light from the light emitting layer in order to utilize light interference. Therefore, a semi-transmissive electrically conductive layer, such as a magnesium-silver (MgAg) thin film having a thickness of approximately 5 to 20 nm, can be used as the second electrode 130. The cavity structure refers to a structure that resonates the light from the light emitting layer between the first electrode 110 and the second electrode 130, and extracts the light from the second electrode 130.

In the present exemplary embodiment, the first electrode 110 is the reflective electrode, and includes a stack of at least a metallic layer and a mixture layer containing a metal having lower reflectance than a metal of the metallic layer. The reflectance of an object varies depending on a thickness of the object and a wavelength. The metallic layer has metallic luster.

In the present disclosure, when the metallic layer (an electrically conductive layer) contains a metal A and the mixture layer is a mixture layer of the metal A and a metal B, the metallic layer (the electrically conductive layer) is defined to be a portion in which a value of a component of the metal B is equal to or lower than a detection limit (including noise) in, for example, the Transmission Electron Microsopy-Energy Dispersive X-ray Spectroscopy (TEM-EDX) analysis. Further, the mixture layer is defined to be a portion in which both a component of the metal A and the component of the metal B have values exceeding the detection limit.

Further, in the present disclosure, the reflectance of a metal or a member refers to reflectance of a film (a member) having a film thickness sufficient to allow the film or the member made from this metal to keep the reflectance approximately constant. That the metal A has higher reflectance than reflectance of the metal B means that the reflectance of the metal A is higher than the reflectance of the metal B with respect to the same wavelength when a film made from the metal A alone and a film made from the metal B alone have thicknesses sufficient keep both the reflectance ratios approximately constant. The wavelength of the light when the reflectance is analyzed and compared can be set according to a color of light emitted from each pixel 200. The thickness sufficient to also keep the reflectance approximately constant can be set to be, for example, 0.1 mm.

The metallic layer can be made from a highly reflective metal. For example, aluminum (Al), sliver (Ag), chromium (Cr), nickel (Ni), platinum (Pt), tin (Sn), or an alloy of any of these metals can be used for the metallic layer. Desirably, Al, Ag, or an alloy of any of them can be used. The metallic layer includes not only an electrically conductive layer made from the metal alone but also an electrically conductive layer made from an alloy of this metal, and may contain another element unintentionally accidentally mixed as an impurity due to manufacturing conditions. For example, a high melting point metal, such as titanium (Ti), molybdenum (Mo), and tungsten (W), can be used as the metal having the lower reflectance than the above-described metal.

The mixture layer containing the metal having the lower reflectance than the metal of the metallic layer may be not only a mixture layer of the high melting point metal and the highly reflective metal but also a mixture layer of a compound of the high melting point metal and the highly reflective metal. In other words, the mixture layer may contain a metal of an electrically conductive layer in the metal of the metallic layer or contain the metal of the metallic layer in the metal of the electrically conductive layer, and these metals may be alloyed or may not be alloyed.

In the case where the material having the high reflectance, such as aluminum and silver, is used as the material of the metallic layer, these metals are easily oxidized. In the organic light emitting apparatus, the metallic layer may be oxidized due to inward diffusion of oxygen from a material containing the oxygen that is disposed on the first electrode 110, such as the organic layer 120, or inward diffusion of oxygen during a heating process under an atmosphere containing the oxygen in a manufacturing process.

Therefore, the oxidation of these metallic layers can be prevented by providing the high melting point metal layer, such as Ti, Mo, and H, on the above-described metallic layer. However, the high melting point metal has lower reflectance than the metal such as aluminum and silver, and therefore the reflectance of the first electrode 110 undesirably reduces. If a film thickness of the high melting point metal layer is simply reduced, the oxygen in the high melting point metal layer is diffused and then reaches the metallic layer. Therefore, the oxidation of the metal of the metallic layer cannot be prevented or reduced.

Further, a stack of the metallic layer and the electrically conductive layer may be used as the first electrode 110 to adjust a work function between the metallic layer and the organic layer 120. In this case, the reflectance of the first electrode 110 also undesirably reduces if reflectance of the metal contained in the electrically conductive layer is lower than the reflectance of the metal of the metallic layer.

Therefore, the oxidation of the metallic layer cart be prevented or reduced while the reduction in the reflectance can be prevented or cut down, by providing the mixture layer of the metal contained in the metallic layer and the metal having the lower reflectance than the metal contained in the metallic layer between the metallic layer and the organic layer 120. Further, the work function can be adjusted while the reduction in the reflectance of the first electrode 110 can be prevented or cut down, by, for example, adjusting a mixture ratio of the highly reflective metal and the metal contained in the electrically conductive layer. Therefore, a degree of freedom of design parameters (for example, the kind of the material, the ratio, and the film thickness) of the electrically conductive layer can be increased.

Further, the metal contained in the mixture layer does not have to be the metal contained in the metallic layer. In the case where the mixture layer is provided to prevent the oxidation of the metallic layer, the mixture layer can fulfil the purpose if the mixture layer configured to contain a metal for the prevention of the oxidation and a metal having higher reflectance than the metal. Further, in the case where the mixture layer is provided to adjust the work function, the mixture layer can fulfil the purpose if the mixture layer is configured to contain a metal for the adjustment of the work function and a metal having higher reflectance than the metal and suitable for the adjustment of the work function.

In the following description, a specific configuration example of the organic light emitting element EL according to the present exemplary embodiment will be described.

Figure 3:
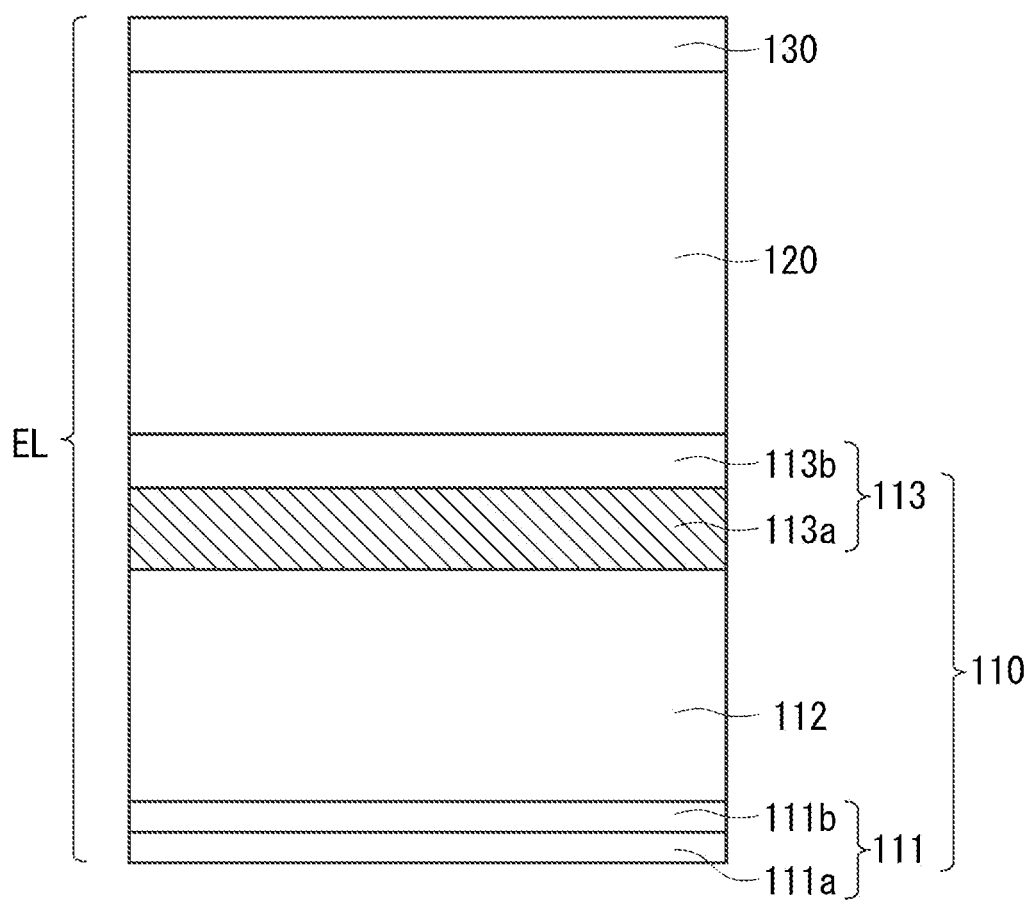
FIG. 3 is a cross-sectional view of one example of an organic light emitting element in the organic light emitting apparatus according to the first exemplary embodiment.

A configuration of the first electrode 110 will be described with reference to FIG. 3. In FIG. 3, the first electrode 110 includes a metallic layer 112, a mixture layer 113a, and an electrically conductive layer 113b. A material having high reflectance in a wavelength band of visible light can be used as a metal of the metallic layer 112, and, for example, Al, Ag, or an alloy containing any of them can be used for the metal of the metallic layer 112. Alternatively, other metals usable for the metal of the metallic layer 112 also include Ni, Mo, Cr, gold (Au), Pt, or an alloy containing any of them in the present example, the first electrode 110 will be described based on an example in which the metallic layer 112 is made from Al. Further, desirably, a film thickness of the metallic layer 112 is a thickness allowing the metallic layer 112 to acquire desired reflectance and being smaller than a film thickness of the organic layer 120. The film thickness of the metallic layer 112 can be set in a range of, for example, 10 to 100 nm. Desirably, reflectance of the metallic layer 112 is 60% or higher with respect to at least light having a wavelength corresponding to the color of the corresponding pixel 200.

The first electrode 110 may be configured to include a barrier metal layer 111 between the metallic layer 112 and the insulating layer (for example, a silicon oxide film) serving as the foundation of the metallic layer 112. A known material can be employed as the barrier metal layer 111. In the present example, the first electrode 110 will be described based on an example in which the barrier metal layer 111 includes a first barrier metal layer 111a made from Ti and a second barrier metal layer 111b made from TiN.

It is desirable to provide the barrier metal layer 111 especially in the case where the metallic layer 112 is made of the layer containing Al or the Al alloy. Especially, employing the Ti film as the barrier metal layer 111 improves an orientation property of the Al film of the metallic layer 112, and thus facilitates formation of the metallic layer 112 having a smooth surface. As a result, evenness of the film thickness of the metallic layer 112 can be improved, and a failure of film formation due to unevenness of the surface of the metallic layer 112 can be prevented or reduced even when the mixture layer 113a and the electrically conductive layer 113b are desired to have smaller film thicknesses.

For example, Ti, Mo, N, or a compound containing any of them (a nitrogen compound or an oxygen compound) can be used as a material of the electrically conductive layer 113b. For example, TiN can be used as the compound.

It is desirable that the film thicknesses of the mixture layer 113a and the electrically conductive layer 113b are set in such a way that a sum of the film thicknesses of the mixture layer 113a and the electrically conductive layer 113b is equal to or larger than a depth at which the oxygen would be diffused, in consideration of the oxygen diffusion from, for example, the organic layer side. Further, it is desirable that the film thicknesses of the mixture layer 113a and the electrically conductive layer 113b are set in such a way that the reflectance of the first electrode 110 is sufficiently desired reflectance with the mixture layer 113a and the electrically conductive layer 113b stacked on the metallic layer 112. Therefore, it is desirable to set the film thicknesses of the mixture layer 113a and the electrically conductive layer 113b to film thicknesses determined in consideration of the oxygen diffusion and the reflectance, and these film thicknesses can be set to, for example, 1 nm to 20 nm. Desirably, the reflectance of the first electrode 110 is at least 50% or higher.

In the present exemplary embodiment, the mixture layer 113a refers to a region containing the metal of the metallic layer 112 and the metal of the electrically conductive layer 113b, and, for example, the mixture layer 113a is located between the metallic layer 112 and the electrically conductive layer 113b as illustrated in FIG. 3. A metal used as a high melting point metal contained in the mixture layer 113a is such a metal that an oxide of the high melting point metal has higher electric conductivity than electric conductivity of an oxide of the metal of the metallic layer 112. Further, the mixture layer 113a is formed in such a manner that the metal of the metallic layer 112 is distributed in the electrically conductive layer 113b along a film thickness direction while the film thickness of the mixture layer 113a is adjusted according to the depth of the oxygen diffused from a front layer (a surface on a side where the organic layer 120 is formed) of the first electrode 110.

In a case where the metallic oxide of the metallic layer 112 is highly insulating, electric conductivity of the first electrode 110 significantly reduces if an interface of the metallic layer 112 on the side closer to the electrically conductive layer 113b is entirely oxidized due to the diffusion of the oxygen into the first electrode 110 from the surface on the side closer to the organic layer 120. As a result, a driving voltage of the organic light emitting apparatus increases. On the other hand, the electric conductivity of the oxide of the high melting point metal contained in the mixture layer 113a is higher than the electric conductivity of the oxide of the metal of the metallic layer 112. In the organic light emitting apparatus according to the present exemplary embodiment, the mixture layer 113a is formed in such a manner that the metal of the metallic layer 112 is distributed in the electrically conductive layer 113b along the film thickness direction according to the depth at which the oxygen is diffused from the front layer of the first electrode 110. Therefore, the present exemplary embodiment can prevent or reduce the undesirable oxidation of the entire surface of the metallic layer 112. In other words, the present exemplary embodiment can prevent or cut down the reduction in the electric conductivity of the first electrode 110 due to the oxidation of the surface of the metallic layer 112.

Further, since the electrically conductive layer 113b is not provided alone but the metal of the metallic layer 112 is distributed in the high melting point metal of the electrically conductive layer 113b, the present exemplary embodiment can prevent or cut down the reduction in the reflectance of the first electrode 110, compared to a case where the oxidation of the surface of the metallic layer 112 is prevented or reduced only with use of the electrically conductive layer 113b.

The mixture layer 113a may be disposed on the metallic layer 112 as a continuous film covering an entire interface with the electrically conductive layer 113b or an entire interface with the organic layer 120, or may be disposed on the metallic layer 112 as a discontinuous film. In other words, the mixture layer 113a may be provided on a part of the interface of the metallic layer 112 with the electrically conductive layer 113b or the interface of the metallic layer 112 with the organic layer 120, and a part of the interface of the metallic layer 112 may not be covered by the mixture layer 113a. Covering at least a part of the interface of the metallic layer 112 by the mixture layer 113a can prevent or cut down an increase in resistance of the first electrode 110 at this portion.

The mixture layer 113a may contain an element other than the metal of the metallic layer 112 and the metal of the electrically conductive layer 113b. The mixture layer 113a containing an element other than the metal of the metallic layer 112 and the metal of the electrically conductive layer 113b may contribute to further preventing or reducing the diffusion of the oxygen. For example, in the case where the metal of the metallic layer 112 is Al and the metal of the electrically conductive layer 113b is Ti, the oxidation of the metallic layer 112 can be further prevented or reduced if the mixture layer 113a contains nitride.

The metal contained in the mixture layer 113a as the metal other than the metal of the electrically conducive layer 113b may be a metal different from the metal of the metallic layer 112. The metal in this case may be any metal that is more reflective than the metal of the electrically conductive layer 113b. Further, the mixture layer 113a may be configured to contain another metal instead of the metal of the electrically conductive layer 113b. The metal contained in the mixture layer 113a can be determined in consideration of a relationship in the electric conductivity, the reflectance, and the transmittance, with the metal of the metallic layer 112.

Further, in the mixture layer 113a, a concentration of the metal of the electrically conductive layer 113b may vary along the film thickness direction. In this case, it is desirable to increase the concentration on the one side of the first electrode 110 where the organic layer 120 is disposed. In this way, it is possible to reduce a rate at which the metal of the metallic layer 112 contained in the mixture layer 113a is oxidized.

Figure 4:
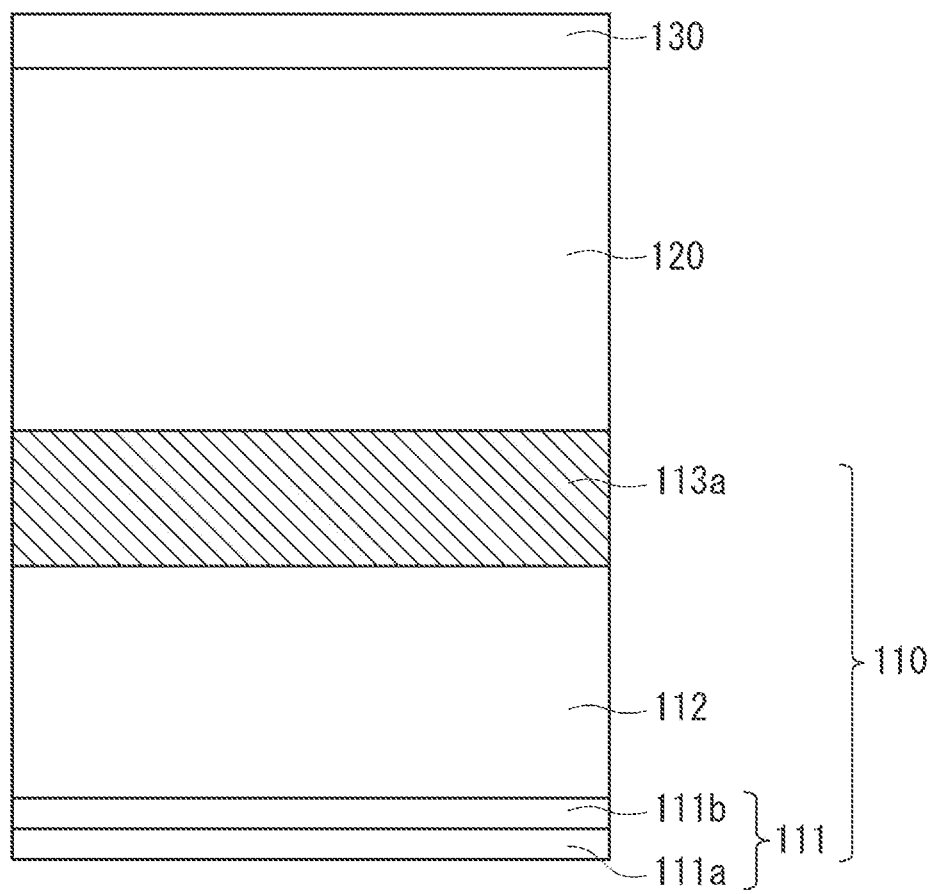
FIG. 4 is a cross-sectional view of one example of the organic light emitting element in the organic light emitting apparatus according to the first exemplary embodiment.

Further, as illustrated in FIG. 4, the first electrode 110 may be configured to include the metallic layer 112 and the mixture layer 113a and not to include the electrically conductive layer 113b. In other words, the surface of the first electrode 110 that is in contact with the organic layer 120 may be the surface of the mixture layer 113a. Even in this case, the organic light emitting apparatus securing sufficient reflectance of the first electrode 110 with a low consumption electrode can also be realized if the mixture layer 113a has the film thickness to be set in consideration of the diffusion of the oxygen into the first electrode 110 during the manufacturing process or the like and the reflectance of the first electrode 110.

An effect of the organic light emitting element EL according to the present exemplary embodiment will be described with use of a table 1.

The table 1 indicates a relationship among the following items with respect to the organic light emitting element including the first electrode 110 using an Al alloy film for the metallic layer 112 and a Ti film for the electrically conductive layer 113b. The items include the film thickness of the electrically conductive layer 113b, and the length of the mixture layer 113a (a region where Al and Ti are mixed) in the film thickness direction (a direction in which the metallic layer 112 and the electrically conductive layer 113b are stacked). Further, the other items are the reflectance of the first electrode 110 that was observed with a wavelength of 450 nm and the driving voltage when a current flows in the organic light emitting element at a current density 50 mA/cm$^2$. The oxygen is diffused in the mixture layer 113a and the electrically conductive layer 113b of the organic light emitting element.

In the table 1, conditions A to D correspond to examples of the organic light emitting element EL described in the first exemplary embodiment and an organic light emitting element described in a second exemplary embodiment, and a condition E corresponds to a comparative example and indicates an example in a case of an organic light emitting element not including the mixture layer 113a. The reflectance and the driving voltage are indicated as values measured with the organic light emitting element including only the first electrode 110 (without the organic layer 120 and the second electrode 130 formed).

TABLE 1

| Condition | Length of Mixture Layer in Film Thickness Direction | Film Thickness of Electrically Conductive Layer | Reflectance | Driving Voltage |
| --- | --- | --- | --- | --- |
| A | 5 | 10 | 80 | 4.2 |
| B | 10 | 10 | 80 | 4.2 |
| C | 10 | 05 | 83 | 4.2 |
| D | 20 | 0 | 86 | 4.3 |
| E | 0 | 0 | 91 | 6.5 |

In the configurations of the first electrode 110 under the conditions A to D indicated in the table 1, the reflectance increased as the film thickness of the electrically conductive layer 113b reduced. However, the driving voltage of the organic light emitting element increased due to the oxidation of the metallic layer 112 as the film thickness of the electrically conductive layer 113b reduced with the film thickness of the mixture layer 113a kept constant. Therefore, under the conditions A to D indicated in the table 1, the length of the mixture layer 113a in the film thickness direction was increased when the film thickness of the electrically conductive layer 113b was reduced. As a result, the driving voltage required to allow a constant current to flow in the organic light emitting element is approximately the same among the organic light emitting elements under the conditions A to D.

On the other hand, under the condition E, which is the comparative example, the first electrode 110 exhibited high reflectance but the driving voltage of the organic light emitting element undesirably increased because the organic light emitting element does not include the mixture layer 113a or the electrically conductive layer 113b.

From the table 1, it can be understood that adjusting a combination of the film thicknesses of the mixture layer 113a and the electrically conductive layer 113b can prevent or cut down the reduction in the reflectance without causing the increase in the driving voltage of the organic light emitting element. More specifically, the film thickness of the mixture layer 113a, or the sum of the film thicknesses of the mixture layer 113a and the electrically conductive layer 113b is adjusted in consideration of the diffusion of the oxygen into the first electrode 110 from the one side where the organic layer 120 is disposed and the reflectance of the first electrode 110. This adjustment can prevent or cut down the reduction in the reflectance without causing the increase in the driving voltage of the organic light emitting element.

Figure 5:
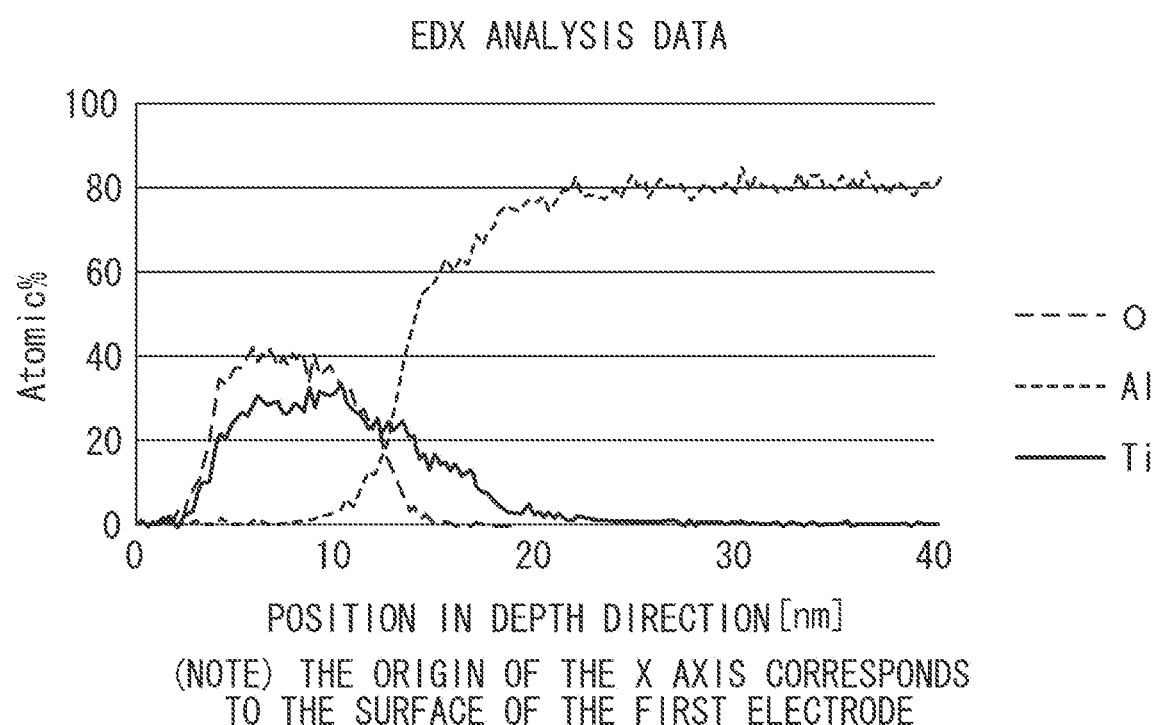
FIG. 5 is a graph indicating a result of a composition analysis of one example of a first electrode in the organic light emitting apparatus according to the first exemplary embodiment.

Further, FIG. 5 illustrates a profile of each of the elements (Al, Ti, and O) in the depth direction (the film thickness direction) of the first electrode 110 in the structure of the first electrode 110 under the condition B indicated in the table 1.

The profile is a result of measurement by the TEM-EDX method. For example, in the case where the Al alloy is used for the metallic layer 112 and Ti is used for the electrically conductive layer 113b, Al and Ti are contained in the mixture layer 113a.

As illustrated in FIG. 5, Ti contained in the electrically conductive layer 113b was detected from around a portion located 10 nm away from the surface of the first electrode 110, so that the film thickness of the electrically conductive layer 113b was 10 nm under the condition B. Further, Al is equal to or lower than the detection limit at around a portion located 20 nm away from the surface of the first electrode 110, so that the length of the mixture layer 113a in the film thickness direction was 10 nm.

Next, a method for manufacturing a part of the organic light emitting apparatus according to the present exemplary embodiment will be described.

The driving transistor Tr2 is formed on the silicon substrate 100 by a known method. An interlayer insulating film is formed on the driving transistor Tr2, and an opening is formed and then a plug is formed in the interlayer insulating film. Then, a wiring layer is formed. The multilayered wiring structure 102 formed by repeating the formation of the interlayer insulating film, the plug, and the wiring layer. In the multilayered wiring structure 102, a planarized insulating film is formed on an uppermost wiring layer, and the plug 103 is formed in the planarized insulating film.

A barrier metal film, a metallic film, and an electrically conductive film that will become the barrier metal layer 111, the metallic layer 112, and the electrically conductive layer 113, respectively, are formed on this planarized insulating film by a film formation method such as sputtering. The barrier metal layer 111 can be prepared by, for example, forming a film in which Ti and TiN are stacked. An Al alloy film having a film thickness of 50 nm can be formed as the metallic layer, and a Ti film having a film thickness 10 nm can be formed on the metallic layer as the electrically conductive film.

The reflectance of the surface of the metallic layer 112 after the formation of the Al alloy layer that is the metallic layer 112 is 90% or higher. Further, the film thicknesses of the Al alloy film and the Ti film are adjusted in such a manner that the electrically conductive film (the Ti film) that will become the electrically conductive layer 113 on the metallic layer 112 achieves reflectance of 80% or higher on the surface of the electrically conductive layer 113 which has been formed. After that, the mixture layer 113a is formed by heating the metallic layer and the electrically conductive film for 30 minutes under a nitrogen atmosphere at 350 degrees Celsius.

The metal (Ti) contained in the electrically conductive film is diffused in the metallic layer and a mixture film of Al and Ti is formed by performing the heating processing after forming the electrically conductive that will become the electrically conductive layer 113. If the heating temperature is low, the mixture layer is not substantially formed. Therefore, desirable to set the temperature of the heating processing to 300 degrees Celsius or higher.

After that, the metallic layer 112, the mixture layer 113a, and the electrically conductive layer 113b can be formed by patterning the metallic film, the mixture layer, and the electrically conductive film. This heating processing causes the Ti film that will become the electrically conductive layer 113b to have a film thickness of 5 nm, the mixture layer of Ti and Al that will become the mixture layer 113a to have a length 10 nm in the film thickness direction, and the Al film that will become the metallic layer 112 to have a film thickness of 45 nm. It is desirable to cause the mixture layer to have a length of 10 nm or more in the film thickness direction to prevent or reduce the oxidation of the metallic layer 112.

In the present example, the manufacturing method has been described based on the example in which the heating processing is performed after the formation of the electrically conductive film that will become the electrically conductive layer 113b. However, in a case where the organic light emitting element includes a bank insulating layer as discussed in the second exemplary embodiment, the heating processing and the formation of an insulating film that will become the bank insulating layer may be simultaneously performed as a single process. In this case, the metallic film and the electrically conductive film are patterned, and the insulating film that will become the bank insulating layer is formed at, desirably, 300 degrees Celsius or higher. At this time, the mixture layer 113a is formed.

As the mixture layer 113a, a layer containing the metal usable to form the metallic layer 112 and the metal usable to form the electrically conductive layer 113b may be formed by the sputtering method. The layer may be formed by sputtering using an alloy target or may be formed by the binary-system sputtering method. Alternatively, the layer may be formed by stacking a plurality of layers in such a manner that the ratio of the metal usable to form the metallic layer 112 and the metal usable to form the electrically conductive layer 113b varies along the film thickness direction.

In the process for forming the metallic layer 112 and the electrically conductive layer 113b, oxidation of the surface of the metallic layer 112 is prevented by staking the metallic layer 112 and the electrically conductive layer 113b without exposing the metallic layer 112 and the electrically conductive layer to an atmosphere during the process. After that, the first electrode 110 separated for each pixel 200 is formed by photolithography and wet etching. The wet etching allows a side surface of the first electrode 110 to have a forward tapered slope, and therefore can prevent a stepped cut and reduce local thinning of the film for the organic layer 120 and the second electrode 130 formed thereon. Therefore, the method eliminates a necessity of increasing the film thickness of the first electrode 110 to prevent the stepped cut and reduce the local thinning of the film for the organic layer 120 and the second electrode 130. Therefore, the method allows the film thicknesses of the mixture layer 113a and the electrically conductive layer 113b to be adjusted in a wider range.

Next, the organic layer 120 is formed on the first electrode 110 and the multilayered wiring structure 102 by, for example, the vacuum deposition method. The organic layer 120 includes the light emitting layer, and may include at least one of the hole injection layer, the hole transport layer, the electron transport layer, and the electron injection layer in addition to the light emitting layer. A region where the organic layer 120 is not desired to be formed, such as an electrode pad portion and a scribe region (not illustrated) can be covered in advance with use of a mask such as a metallic mask.

The second electrode 130 made of an AgMg thin film (for example, a film thickness thereof is approximately 10 nm) is formed by, for example, the deposition method after the organic layer 120 is formed. In the organic light emitting apparatus according to the present exemplary embodiment, the first electrode 110 is formed individually for each pixel 200, but the second electrode 130 is formed as a common electrode (continuous electrode) to the plurality of pixels 200.

Next, the moisture exclusion layer 140 is formed by, for example, the chemical vapor deposition (CVD) method or the atomic layer deposition (ALD) method. The moisture exclusion layer 140 may be a single layer structure made from the same material, or may be a stack of layers made from different materials or layers having different film properties so as to be equipped with a further high moisture exclusion performance. The moisture exclusion layer 140 can be formed with use of, for example, silicon nitride (SiN).

Next, for example, the color filter layer 160 can be formed after an insulating film functioning as the planarization layer 150 is formed on the moisture exclusion layer 140 to planarize unevenness of a surface of the moisture exclusion layer 140. Next, an electrode pad portion (not illustrated) is exposed by removing the moisture exclusion layer 140 by the photolithography and dry etching method. The organic light emitting apparatus can be formed in this manner.

The organic light emitting apparatus according to the exemplary embodiment described so far is the organic light emitting apparatus that prevents or cuts down the reduction in the reflectance of the first electrode because the metallic layer and the mixture layer are stacked in the first electrode. Further, the organic light emitting apparatus is the organic light emitting apparatus that prevents or cuts down the increase in the driving voltage because the mixture layer contains the metal of the metallic layer and the metal whose oxide is more electrically conductive than the oxide of the metal of the metallic layer. Further, the organic light, emitting apparatus can prevent or cut down the increase in the resistance of the first electrode due to the oxidation of the metallic layer while preventing or cutting down the reduction in the reflectance of the first electrode.

In the present exemplary embodiment, the organic light emitting apparatus has been described based on the example in which the mixture layer 113a is disposed to prevent or reduce the oxidation of the metallic layer 112 of the first electrode 110 as a specific example, but the organic light emitting apparatus according to the present exemplary embodiment is not limited to this case. A similar effect can also be acquired even in the case where the mixture layer 113a is disposed to adjust the work function of the first electrode 110. More specifically, in the case where the metal of the layer for the adjustment of the work function that is disposed on the metallic layer 112 has lower reflectance than the metal of the metallic layer 112, the reflectance of the first electrode 110 reduces if a single layer made from the metal for the adjustment is disposed on the metallic layer 112.

Therefore, the reduction in the reflectance of the first electrode 110 can be prevented or cut down by forming the first electrode 110 as a stack of the metallic layer 112 and the mixture layer 113a containing the metal for the adjustment of the work function and a metal having higher reflectance than the metal for the adjustment. For example, the mixture layer 113a can be a layer containing titanium (Ti), which is the metal for the adjustment of the work function, and aluminum (Al), which is the metal of the metallic layer 112 and is the metal having higher reflectance than titanium. The organic light emitting apparatus can also succeed in preventing or cutting down the reduction in the reflectance of the first electrode 110 while reducing the driving voltage of the organic light emitting apparatus by adjusting the work function of the first electrode 110 with use of this configuration.

Second Exemplary Embodiment

An organic light emitting apparatus according to the second exemplary embodiment and a method for manufacturing it will be described with reference to FIGS. 6 to 9. Differences between the present exemplary embodiment and the first exemplary embodiment are that the first electrode has a different structure and the organic light emitting apparatus includes the bank insulating layer in the present exemplary embodiment. Descriptions of a configuration, a function, a method, and an effect similar to the first exemplary embodiment will be omitted in the following description.

Figure 6:
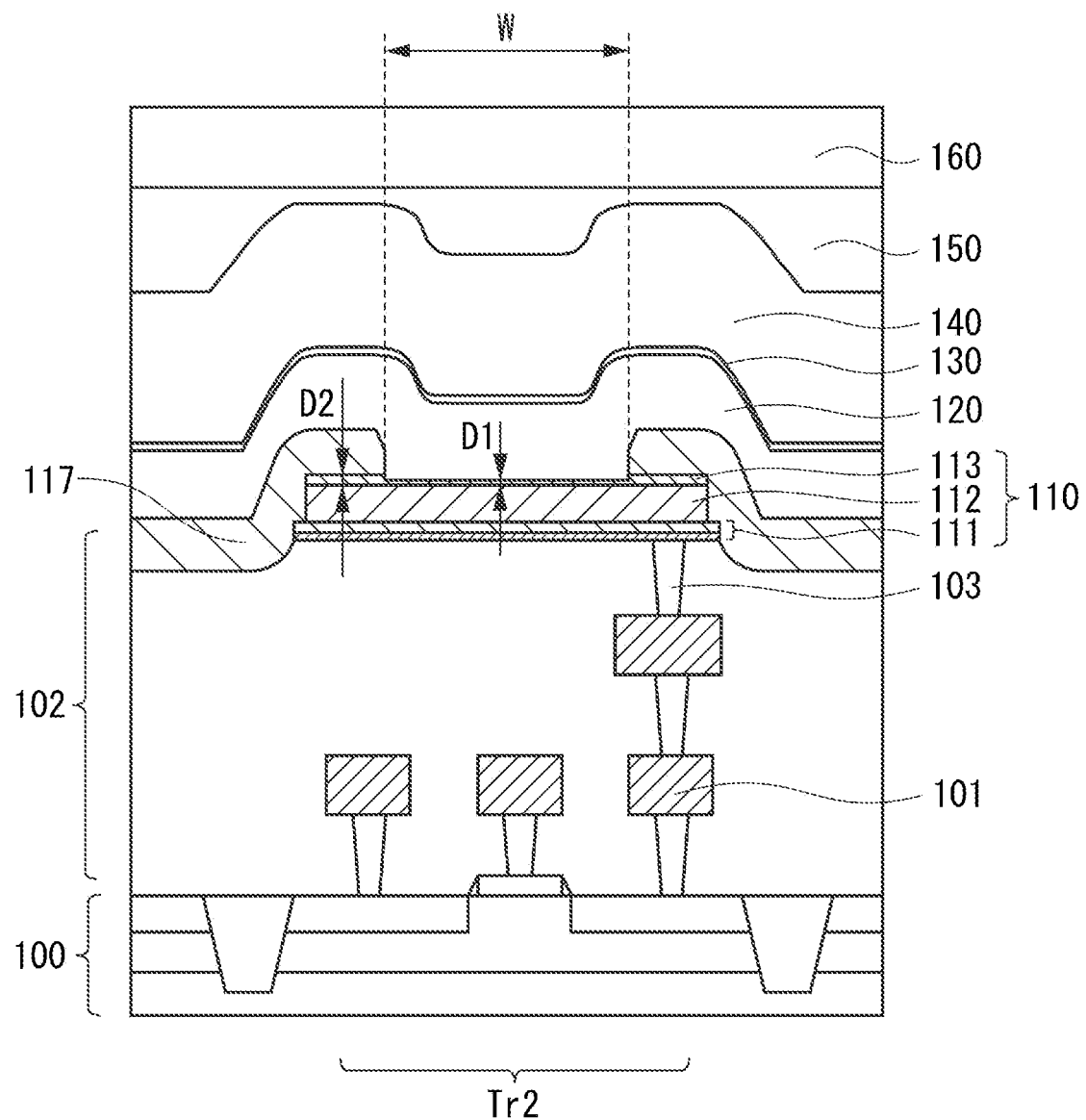
FIG. 6 is a cross-sectional view of one example of a pixel unit in an organic light emitting apparatus according to a second exemplary embodiment.

FIG. 6 is a cross-sectional view illustrating a structure of a part of a pixel forming the organic light emitting apparatus according to the present exemplary embodiment. The organic light emitting apparatus illustrated in FIG. 6 includes the substrate 100, the transistor Tr2, the multilayered wiring structure 102 including the wirings 101, the first electrode 110, a bank insulating layer 117, the organic layer 120, the second electrode 130, the moisture exclusion layer 140, the planarization layer 150, and the color filter 160. The first electrode 110 is patterned for each pixel, and has an island-like form.

The bank insulating layer 117 is an insulating member covering an end portion (an outer edge portion on a top surface and a side surface thereof) of the first electrode 110 for each pixel. The bank insulating layer 117 can reduce or prevent a leak and short-circuiting between the first electrode 110 and the second electrode 130 even when the organic layer 120 is thinned in a region overlapping the end portion of the first electrode 110 as viewed in a planar view. Now, the planar view refers to a planar view in terms of the surface of the first electrode 110 where the organic layer 120 is disposed.

More specifically, the bank insulating layer 117 includes an opening W on the first electrode 110. The opening region of the bank insulating layer 117 on the first electrode 110 corresponds to a light emitting region of the organic light emitting element EL. Such a bank insulating layer 117 is in contact with the organic layer 120, and therefore is desirably formed with use of a material having small water content and low moisture permeability. For example, the bank insulating layer 117 can be an inorganic insulating layer, and, in particular, can be formed with use of an inorganic insulating material such as silicon oxide, silicon nitride, and silicon oxynitride (SiON).

The first electrode 110 has a first film thickness in the opening W of the bank insulating layer 117, and has a second film thickness thicker than the first film thickness in a region covered by the bank insulating layer 117.

As illustrated in FIG. 6, for example, assume that D1 represents a film thickness of the electrically conductive layer 113 in the opening W of the bank insulating layer 117, and D2 represents a thickness of the electrically conductive layer 113 in the portion covered by the bank insulating layer 117. In the present exemplary embodiment, the first electrode 110 is configured in such a manner that the film thicknesses D1 and D2 satisfy a relationship D1<D2. FIG. 6 illustrates the organic light emitting apparatus in the case where the electrically conductive layer 113 includes only the mixture layer 113a, but the electrically conductive layer 113 may include both the mixture layer 113a and the electrically conductive layer 113b, or may include only the mixture layer 113a.

More specifically, in the case where the electrically conductive layer 113 includes only the mixture layer 113a, the mixture layer 113a has a smaller film thickness in the opening W of the bank insulating layer 117 than in the region covered by the bank insulating layer 117. In the case where the electrically conductive layer 113 includes the mixture layer 113a and the electrically conductive layer 113b, the electrically conductive layer 113b may have a smaller film thickness in the opening W of the bank insulating layer 117 than in the region covered by the bank insulating layer 117. Alternatively, while the electrically conductive layer 113 includes the mixture layer 113a and the electrically conductive layer 113b, the mixture layer 113a may be placed as the surface of the first electrode 110 with the electrically conductive layer 113b removed in the opening W. In other words, the electrically conductive layer 113 may include the mixture layer 113a, and the electrically conductive layer 113b having an opening at a position overlapping the opening W of the bank insulating layer 117. In this case, the mixture layer 113a has a smaller film thickness in the opening W of the bank insulating layer 117 than in the region covered by the bank insulating layer 117.

For example, the first film thickness D1 of the electrically conductive layer 113 in the opening W of the bank insulating layer 117 can be set to approximately half the film thickness D2 of the electrically conductive layer 113 in the region covered by the bank insulating layer 117. In the organic light emitting apparatus illustrated in FIG. 6, for example, the film thickness D1 of the electrically conductive layer 113 in the opening W can be set to 5 nm, and the film thickness D2 in the portion covered by the bank insulating layer 117 can be set to 15 nm. In this case, the first electrode 110 has high reflectance in the opening W. The film thickness of the mixture layer 113a is desirably 5 nm or more, and more desirably 10 nm or more so as to be able to prevent or reduce the oxidation of the entire surface of the metallic layer 112 even when the oxygen is diffused into the mixture layer 113a.

In the case where the bank insulating layer 117 is made from, for example, silicon oxide, the silicon oxide serves as a source supplying oxygen to the first electrode 110, and the oxygen is diffused into the first electrode 110. Therefore, a region of the first electrode 110 that is in contact with the bank insulating layer 117 configured to prevent the metallic layer 112 from being oxidized due to the oxygen diffused from the bank insulating layer 117. More specifically, it is desirable to set the film thickness of the mixture layer 113a, or the film thicknesses of the mixture layer 113a and the electrically conductive layer 113b to a film thickness that prevents the oxygen from reaching as far as the entire surface of the metallic layer 112.

Then, the bank insulating layer 117 is formed by patterning the insulating film, and is formed so as to include the opening W and cover the first electrode 110 around the opening W. The opening W is formed by, for example, removing a part of the insulating layer by etching. Therefore, the insulating film (silicon oxide) serving as the source supplying the oxygen does not exist at the portion of the first electrode 110 in the opening W after the opening W is formed on the insulating film for the formation of the bank insulating layer 117. Therefore, the film thickness of the electrically conductive layer 113 (the mixture layer 113a or the mixture layer and the electrically conductive layer 113b) for preventing the oxidation of the metallic layer 112 can be smaller in a case where the opening W is provided than in a case where the opening W is not provided. Since the film thickness of the electrically conductive layer 113 can be reduced in the opening W, the reflectance of the first electrode 110 the light emitting region can be increased.

Further, if the light emitting apparatus is in such a state that the oxygen is diffused in the electrically conductive layer 113 by a large amount in the process for manufacturing the organic light emitting apparatus, the oxygen contained in the electrically conductive layer 113 may be diffused into the metallic layer 112 and oxidize the metallic layer 112 in the manufacturing process after the electrically conductive layer 113 is formed. Therefore, the electrically conductive layer 113 (the mixture layer 113a, or the mixture layer 113a and the electrically conductive layer 113b) containing the oxygen is partially removed. In other words, the organic light emitting apparatus is configured in such a manner that the film thickness of the mixture layer 113a or the sum of the film thicknesses of the mixture layer 113a and the electrically conductive layer 113b is smaller in the opening W of the bank insulating layer 117 than in the region overlapping the bank insulating layer 117 in the planar view. This configuration can prevent or cut down the increase in the driving voltage of the organic light emitting apparatus due to the oxidation of the first electrode 110, thereby improving reliability the organic light emitting apparatus. Further, because the film thickness of the mixture layer 113a or the electrically conductive layer 113b in the opening W is smaller than that in the organic light emitting apparatus according to the first exemplary embodiment, the present exemplary embodiment is also able to further increase the reflectance of the first electrode 110 in the light emitting region.

The method for manufacturing the organic light emitting apparatus illustrated in FIG. 6 will be described below with reference to FIGS. 7A and 7B. A process in common with the first exemplary embodiment will be omitted.

Figure 7A:
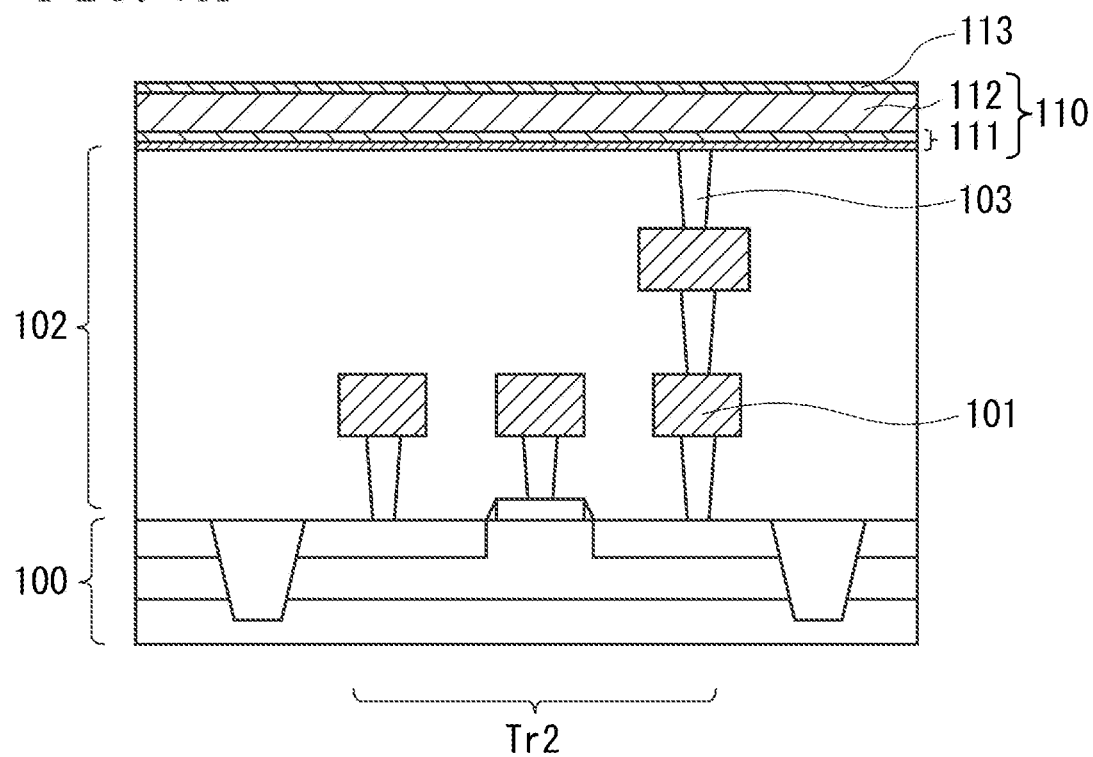
FIGS. 7A and 7B are cross-sectional views illustrating one example of a process for manufacturing the organic light emitting apparatus according to the second exemplary embodiment.

As illustrated in FIG. 7A, a metallic film that will become the barrier metal layer 111, a metallic film that will become the metallic layer 112, and an electrically conductive film (a metallic film) that will become the electrically conductive layer 113 are formed on the substrate 100 with the transistor Tr2 and the multilayered wiring structure 102 formed thereon by a film formation method such as sputtering. For example, a film in which a Ti film and a TiN film are stacked can be used as the barrier metal layer 111. Further, for example, a film made from an Al alloy can be used as the metallic layer 112, and a thin film made from Ti can be formed on the metallic layer 112. It is desirable to adjust film thicknesses of the Al alloy film and the Ti film in such a manner that the reflectance of the surface is 90% or higher after the Al alloy film is formed, and is 80% or higher after the Ti film is formed on the Al alloy film.

Figure 7B:
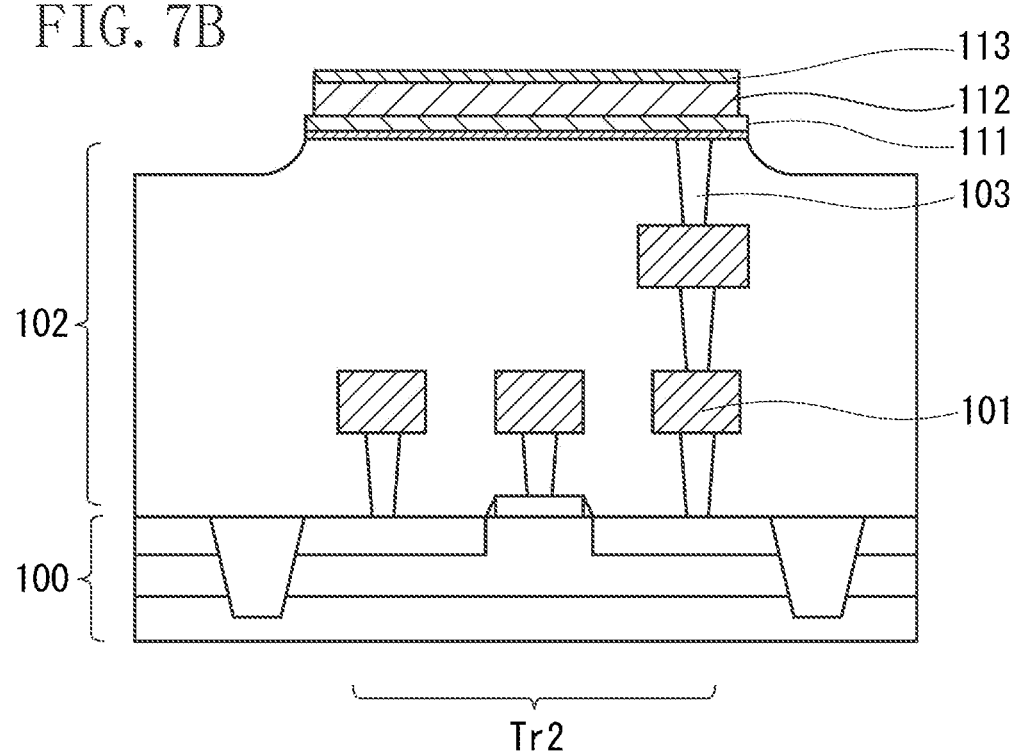

After that, as illustrated in FIG. 7B, the barrier metal layer 111, the metallic layer 112, and the electrically conductive layer 113 are formed by photolithography and dry etching. By this method, the island-like first electrode 110 separated for each pixel is formed. The first electrode 110 can be finely processed by conducting the patterning using the dry etching.

At this time, a portion of the insulating film at the uppermost layer of the multilayered wiring layer 102 that has a top surface not covered by the first electrode 110 has a shape ditched by approximately several dozen run due to overetching in the dry etching process. Therefore, the top surface of the multilayered wiring layer 102 includes the portion covered by the first electrode 110 and the portion not covered by the first electrode 110 and shaped into a recessed portion.

Figure 8A:
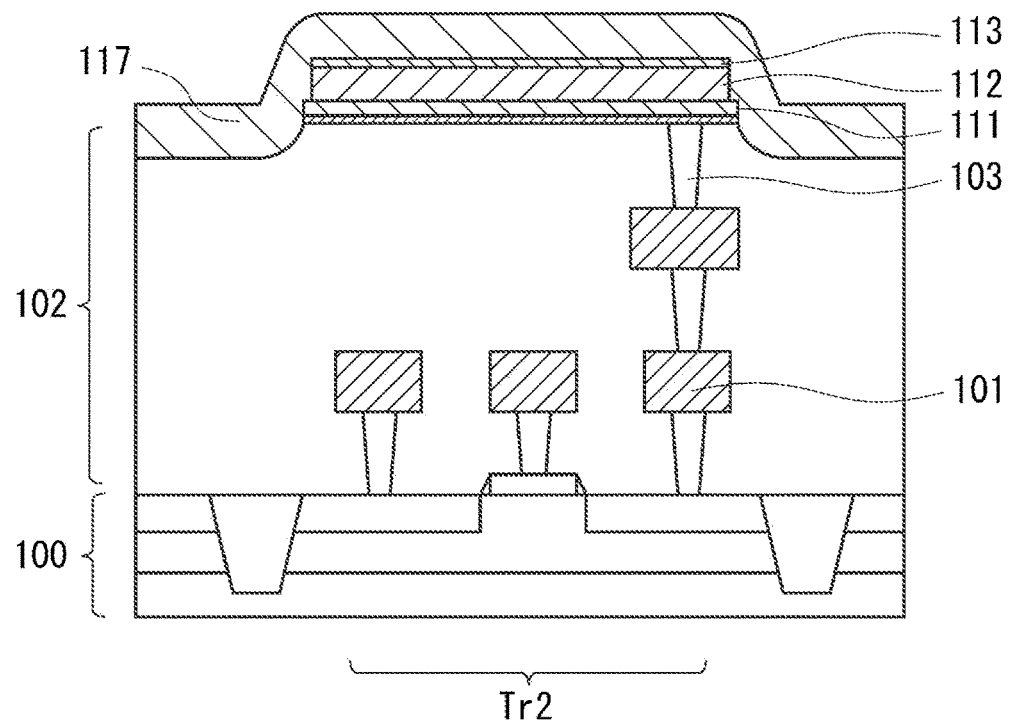
FIGS. 8A and 8B are cross-sectional views illustrating the one example of the process for manufacturing the organic light emitting apparatus according to the second exemplary embodiment.

Next, as illustrated in FIG. 8A, the insulating film (for example, a silicon oxide film) that will become the bank insulating layer 117 is formed on the substrate including the first electrode 110 by the CVD method. Desirably, a film formation temperature in the CVD method is 300 degrees Celsius or higher, and the film can be formed with the temperature set to, example, 300 degrees Celsius to 400 degrees Celsius. During this process, the first electrode 110 is heated, and the mixture layer 113a is formed between the metallic layer 112 and the electrically conductive layer 113b. Therefore, the first electrode 110 may be configured in such a manner that, in the mixture layer 113a, a ratio of the metal of the electrically conductive layer 113b to the metal of the metallic layer 112 (a ratio of the metal of the electrically conductive layer 113b in the mixture layer 113a) is reduced from the organic layer side toward the metallic layer side.

It is desirable to set a film thickness of the insulating film that will become the bank insulating layer 117 to a smaller thickness than the film thickness of the organic layer 120 to be formed on the first electrode 110. However, if there is a portion that the insulating bank 117 cannot cover in the end portion of the first electrode 110, a leakage current and/or short-circuiting may occur between the first electrode 110 and the second electrode 130 at the portion. Therefore, it is desirable to set the film thickness of the insulating bank 117 so as to be equal to or larger than a film thickness that allows the insulating hank 117 to cover the end portion of the first electrode 110 as a continuous film. For example, in a case where the film thickness of the organic layer 120 is set to approximately 200 nm, the film thickness of the bank insulating layer 117 can be set to approximately 70 nm.

Figure 8B:
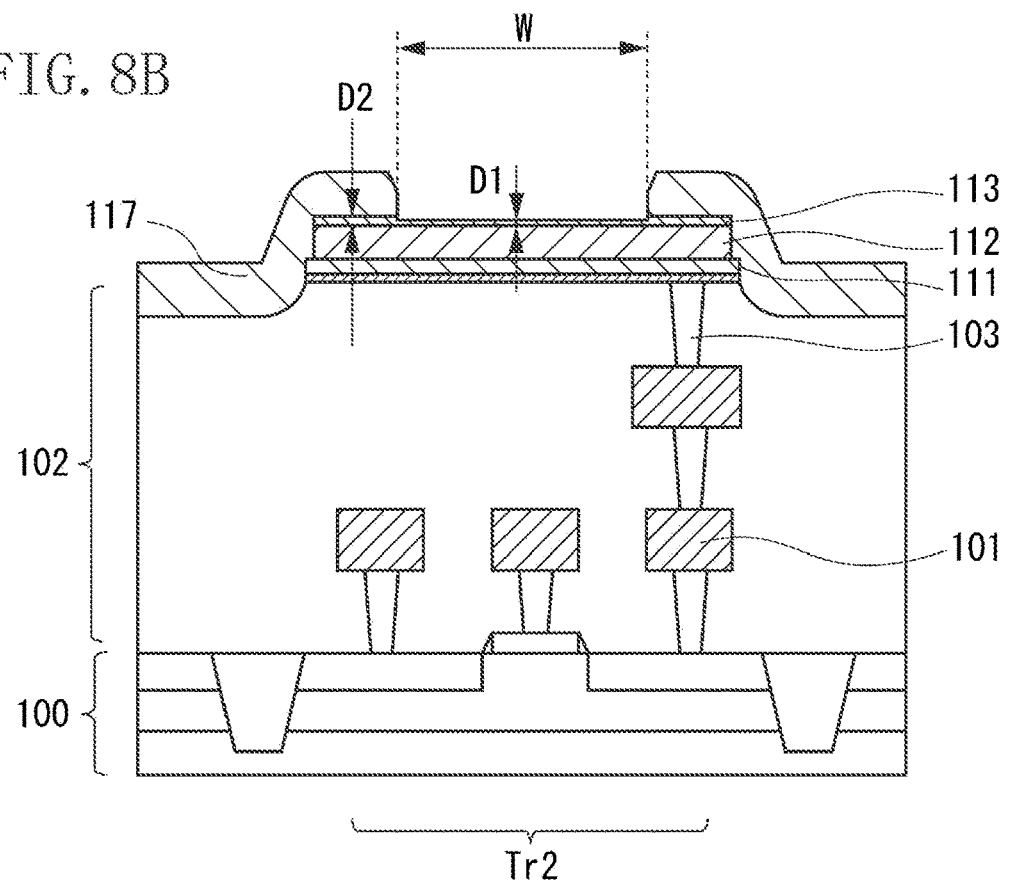

Next, as illustrated in FIG. 8B, the insulating bank 117 is prepared by forming the opening W in the insulating film that will become the insulating bank 117 by photolithography and dry etching. In the present exemplary embodiment, when the opening N is formed, not only the insulating film that will become the insulating bank 117 but also a part of the electrically conductive layer 113 is removed. This removal causes the first electrode 110 to be structured to have the first film thickness D1 in the opening N of the bank insulating layer 117, and have the second film thickness D2 larger than the first film thickness in the region covered by the bank insulating layer 117. Then, if the film thickness of the mixture layer 113a is small, the diffused oxygen may reach the surface of the metallic layer 112 and undesirably oxidize the entire surface of the metallic layer 112. Therefore, it is desirable to set the length of the mixture layer 113a in the film thickness direction to 5 nm or more, more desirably 10 nm or more.

The organic light emitting apparatus can be manufactured in a similar manner to the first exemplary embodiment during and after the process for forming the organic layer 120.

The organic light emitting apparatus according to the present exemplary embodiment also prevents or cuts down the reduction in the reflectance of the first electrode 110 while cutting down or preventing the increase in the driving voltage.

Third Exemplary Embodiment

Figure 9:
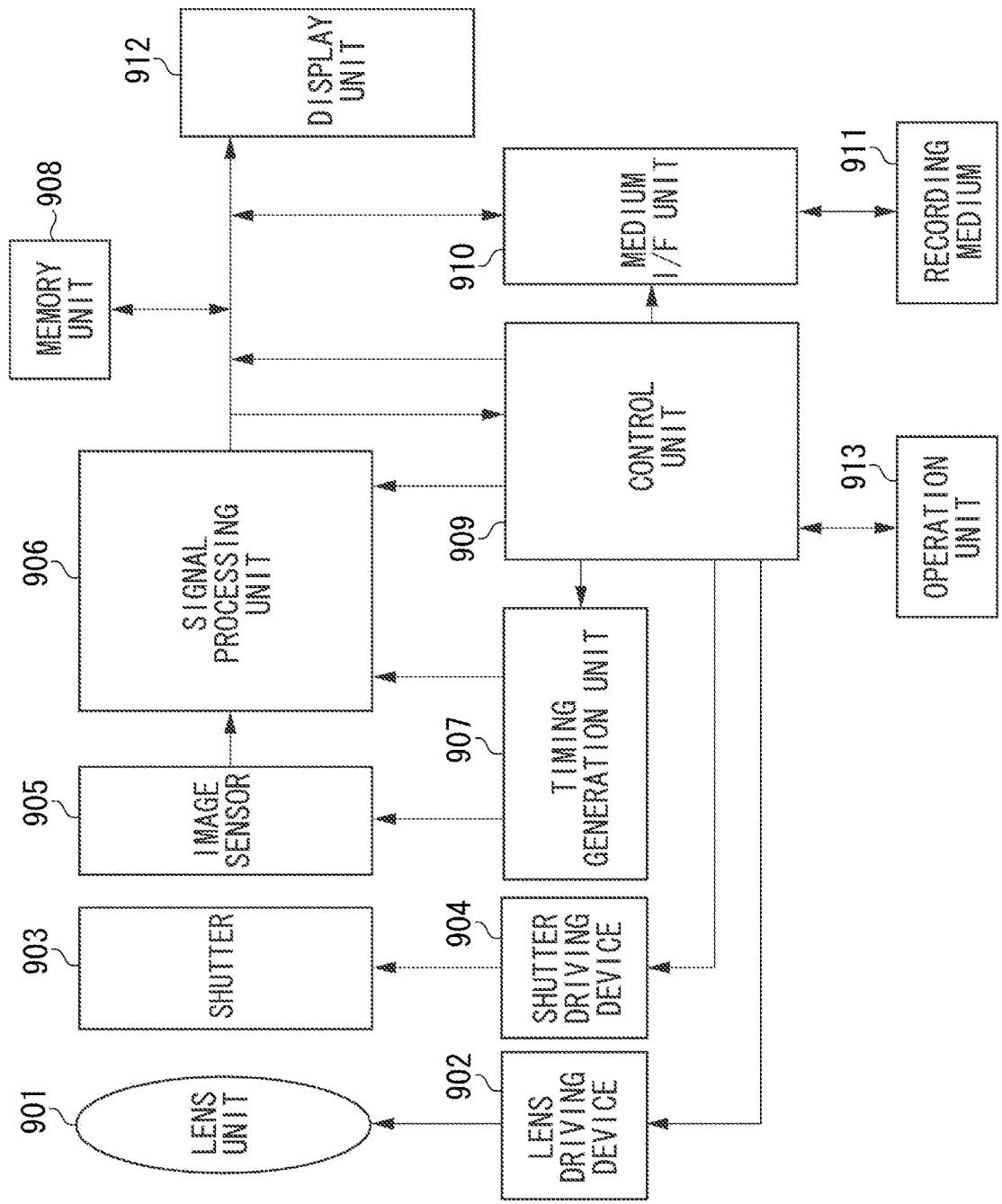
FIG. 9 is a block diagram illustrating one example of an electronic apparatus according to a third exemplary embodiment.

A third exemplary embodiment will be described with reference to FIG. 9 as an example in which the organic light emitting apparatus described in the first or second exemplary embodiment is applied to an electronic apparatus.

An exemplary embodiment in which the above-described image sensor is applied to a digital camera will be described with reference to FIG. 9. A lens unit 901 is an imaging optical system that forms an optical image of an object on an image sensor 905, and includes a focus lens, a magnification varying lens, a diaphragm, and the like. A control unit 909 controls, via a lens driving device 902, driving of a position of the focus lens, a position of the magnification varying lens, an aperture diameter of the diaphragm, and the like in the lens unit 901.

A mechanical shutter 903 is disposed between the lens unit 901 and the image sensor 905, and driving thereof is controlled by the control unit 909 via a shutter driving device 904. The image sensor 905 is disposed so as to allow light from the lens to be incident thereon, and converts the optical image formed by the lens unit 901 into an image signal by a plurality of pixels.

The image signal output from the image sensor 905 is input to a signal processing unit 906, and the signal processing unit 906 performs an analog-to-digital (A/D) conversion, demosaicing processing, white balance adjustment processing, coding processing, and the like on the image signal. The signal processing unit 906 also performs focus detection processing for detecting a defocus amount and direction according to the phase difference detection method based on a signal acquired from the image signal output from the image sensor 905.

A timing generation unit 907 outputs various kinds of timing signals to the image sensor 905 and the signal processing unit 906. The control unit 909 includes, for example, memories (a read only memory (ROM) and a random access memory (RAM)) and a microprocessor (a central processing unit (CPU)), and realizes various kinds of functions of the digital camera by loading a program stored in the ROM into the RAM and causing the CPU to execute the loaded program to control each of the units. The functions realized by the control unit 909 include automatic focus detection (AF) and automatic exposure control (AF). A signal based on the signal output from the image sensor 905 is input to the control unit 909, and, further, the control unit 909 inputs a signal for an electronic viewfinder to a display unit 912.

A memory unit 908 is used to temporarily store image data and used as a work area by the control unit 909 and the signal processing unit 906. A medium interface (I/F) unit 910 is an interface for reading and writing data from and into a recording medium 911, which is, for example, a detachably attachable memory card. The display unit 912 is used to display a captured image and various kinds of information of the digital camera. An operation unit 913 is a user interface used for a user to instruct and set the digital camera, such as a power source switch, a release button, and a menu button.

An increase in power consumption can be prevented or cut down and an emission rate of the display unit 912 can be improved by using the organic light emitting apparatus described in the first or the second exemplary embodiment for the display unit 912. Therefore, visibility of an image displayed on the display unit 912 can be improved even at a bright location.

An operation of the digital camera at the time of imaging will be described. When being powered on, the digital camera is brought into an imaging standby state. The control unit 909 starts moving image capturing processing and display processing for causing the display unit 912 to operate as the electronic viewfinder. When an imaging preparation instruction (for example, half-pressing of the release button of the operation unit 913) is input when the digital camera is in the imaging standby state, the control unit 909 starts the focus detection processing. The control unit 909 can perform the focus detection processing according to, for example, the phase difference detection method. More specifically, the control unit 909 acquires the defocus amount and direction by calculating an image misalignment amount based on a phase difference between signal waveforms defined by connecting the same kind of signals in an A image signal and a B image signal acquired from the plurality of pixels.

Then, the control unit 909 acquires a movement amount and a movement direction of the focus lens of the lens unit 901 from the acquired defocus amount and direction, and drives the focus lens via the lens driving device 902, thereby adjusting a focus of the imaging optical system. The control unit 909 may finely adjust the focus lens position by further carrying out focus detection based on a contrast evaluation value as necessary, after the driving.

After that, when an imaging start instruction (for example, full-pressing of the release button) is input, the control unit 909 performs an imaging operation for recording, processes acquired image data by the signal processing unit 906, and stores the processed image data into the memory unit 908. Then, the control unit 909 records the image data stored in the memory unit 908 into the recording medium 911 via the medium control I/F unit 910. The image data may be output from a not-illustrated external I/F unit to an external apparatus, such as a computer.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-081521, filed Apr. 17, 2017, which is hereby incorporated by reference herein in its entirety.

What is claimed is:

1. An organic light emitting apparatus comprising:
   a first electrode;
   a second electrode; and
   an organic layer including a light emitting layer disposed between the first electrode and the second electrode,
   wherein the first electrode includes a metallic layer containing a first metal and a mixture layer disposed between the metallic layer and the organic layer, and
   wherein the mixture layer contains the first metal and a second metal having lower reflectance than the first metal,
   wherein an end portion of the first electrode is covered by a bank insulating layer,
   wherein the bank insulating layer includes a first opening on the first electrode,
   wherein the organic layer is disposed between the first electrode and the second electrode at the first opening, and
   wherein the first electrode has a first film thickness at the first opening and a second film thickness in a region covered by the bank insulating layer, and the first film thickness is smaller than the second film thickness.

2. The organic light emitting apparatus according to claim 1, wherein the first metal is aluminum or silver.

3. The organic light emitting apparatus according to claim 1, wherein the second metal is at least one of titanium, molybdenum, and tungsten.

4. The organic light emitting apparatus according to claim 1, wherein the first electrode includes an electrically conductive layer disposed between the mixture layer and the bank insulating layer and containing the second metal.

5. The organic light emitting apparatus according to claim 4, wherein the electrically conductive layer is disposed between the mixture layer and the organic layer at the first opening.

6. The organic light emitting apparatus according to claim 4, wherein the electrically conductive layer includes a second opening, and the organic layer is in contact with the mixture layer at the first opening and the second opening.

7. The organic light emitting apparatus according to claim 1, wherein the mixture layer contains oxygen.

8. The organic light emitting apparatus according to claim 1, wherein a length of the mixture layer in a film thickness direction of the first electrode is 10 nm or more.

9. The organic light emitting apparatus according to claim 1, wherein a length of the mixture layer in a film thickness direction of the first electrode is 5 nm or more.

10. The organic light emitting apparatus according to claim 1, wherein the bank insulating layer is an inorganic insulating layer.

11. The organic light emitting apparatus according to claim 1, wherein the bank insulating layer contains silicon oxide.

12. The organic light emitting apparatus according to claim 1, wherein, in the mixture layer, a ratio of the second metal to the first metal is reduced from one side where the organic layer is located toward another side where the metallic layer is located.

13. The organic light emitting apparatus according to claim 1, wherein a ratio of the second metal that accounts for in the mixture layer is reduced from one side where the organic layer is located toward another side where the metallic layer is located.

14. The organic light emitting apparatus according to claim 1,
    wherein the first electrode is disposed on a multilayered wiring structure, and
    wherein an insulating layer of a surface of the multilayered wiring structure includes a recessed portion at a portion not covered by the first electrode.

15. The organic light emitting apparatus according to claim 1, wherein the first electrode is disposed on a multilayered wiring structure disposed on a silicon substrate, and the first electrode and the second electrode are a reflective electrode and a transparent electrode, respectively.

16. An imaging apparatus comprising:
    a lens;
    an image sensor configured in such a manner that light from the lens is incident thereon;
    a control unit configured in such a manner that an output from the image sensor is input thereto; and
    the organic light emitting apparatus according to claim 1, the organic light emitting apparatus being configured in such a manner that a signal from the control unit is input thereto.

17. An organic light emitting apparatus comprising:
    a first electrode;
    a second electrode; and
    an organic layer disposed between the first electrode and the second electrode and including a light emitting layer,
    wherein the first electrode includes
    a metallic layer containing a first metal, and
    a mixture layer disposed between the metallic layer and the organic layer and containing the first metal and a second metal,
    wherein the first metal is aluminum or silver, and wherein the second metal is at least one of titanium, molybdenum, and tungsten, wherein an end portion of the first electrode is covered by a bank insulating layer, wherein the bank insulating layer includes a first opening on the first electrode, and wherein the organic layer is disposed between the first electrode and the second electrode at the first opening, and wherein the first electrode has a first film thickness at the first opening and a second film thickness in a region covered by the bank insulating layer, and the first film thickness is smaller than the second film thickness.

18. The organic light emitting apparatus according to claim 17, wherein the first electrode includes an electrically conductive layer disposed between the mixture layer and the bank insulating layer and containing the second metal.

19. The organic light emitting apparatus according to claim 18, wherein the electrically conductive layer is disposed between the mixture layer and the organic layer at the first opening.

20. The organic light emitting apparatus according to claim 18, wherein the electrically conductive layer includes a second opening, and the organic layer is in contact with the mixture layer at the first opening and the second opening.

21. A method for manufacturing an organic light emitting apparatus, the method comprising:

forming a first electrode;

forming an organic layer including a light emitting layer on the first electrode; and forming a second electrode on the organic layer, wherein the forming the first electrode includes forming a metallic film containing a first metal, and forming a mixture layer containing the first metal of the metallic film, and a second metal having lower reflectance than the first metal, wherein the forming the mixture layer includes forming an electrically conductive film containing the second metal on the metallic film containing the first metal, forming a metallic layer containing the first metal and an electrically conductive layer containing the second metal by partially removing the metallic film containing the first metal and the electrically conductive film containing the second metal, and performing heating processing after forming the metallic layer containing the first metal and the electrically conductive layer containing the second metal.

22. The method for manufacturing the organic light emitting apparatus according to claim 21, wherein the mixture layer is formed due to diffusion of the second metal into the metallic film by the heating processing.

23. The method for manufacturing the organic light emitting apparatus according to claim 21, wherein the performing the heating processing includes forming an insulating film on the electrically conductive layer containing the second metal.

24. The method for manufacturing the organic light emitting apparatus according to claim 21, wherein a temperature in the heating processing is 300 degrees Celsius or higher.

25. The method for manufacturing the organic light emitting apparatus according to claim 23, further comprising:

forming an opening by removing a part of the insulating film by etching after forming the insulating film; and removing a part of the electrically conductive layer at the opening.

* * * * *